United States Patent [19]
Pham et al.

[11] Patent Number: 5,427,301
[45] Date of Patent: Jun. 27, 1995

[54] ULTRASONIC FLIP CHIP PROCESS AND APPARATUS

[75] Inventors: Cuong V. Pham, Livonia; Brian J. Hayden, Royal Oak; Bethany J. Walles, Birmingham, all of Mich.

[73] Assignee: Ford Motor Company, Dearborn, Mich.

[21] Appl. No.: 239,106

[22] Filed: May 6, 1994

[51] Int. Cl.⁶ ............................................. H01L 21/607
[52] U.S. Cl. ............................. 228/110.1; 228/180.22
[58] Field of Search ................ 228/103, 110.1, 180.22, 228/234.1, 1.1, 6.2, 44.7, 49.5

[56] References Cited

U.S. PATENT DOCUMENTS

| | | | |
|---|---|---|---|
| 3,563,443 | 2/1971 | Pedrotti et al. | 228/5.1 |
| 3,986,255 | 10/1976 | Mandal | 228/123.1 |
| 4,842,662 | 6/1989 | Jacobi | 228/110.1 |
| 4,899,921 | 2/1990 | Bendat et al. | 228/6.2 |
| 5,250,843 | 10/1993 | Eichelberger | 257/692 |
| 5,341,979 | 8/1994 | Gupta | 228/111 |
| 5,347,086 | 9/1994 | Potter et al. | 228/180.1 |

*Primary Examiner*—Samuel M. Heinrich
*Attorney, Agent, or Firm*—Roger L. May; Richard D. Dixon

[57] ABSTRACT

A process for bonding a flip chip (20) to a substrate (22) comprising positioning the flip chip (20) above the substrate (22). The flip chip (20) has an active face provided with conductive bumps so that its active face is oriented toward the substrate (22). The flip chip (20) is placed on the substrate (22) so that the bumps align with a bonding pattern on the substrate (22). An ultrasonic horn (30) is lowered having a flat surface onto a back side of the flip chip (20). Force is applied through the ultrasonic horn (30) to the back side of the flip chip (20), which is normal to the substrate (22) so that minimal lateral displacement of the flip chip (20) and the substrate (22) results. The ultrasonic horn (30) is then activated while the force is applied so that the ultrasonic energy is isothermally transferred across the flip chip (20) to the substrate (22) and a diffusion bond is created therebetween.

11 Claims, 14 Drawing Sheets

ULTRASONIC FLIP CHIP PROCESS AND APPARATUS

TECHNICAL FIELD

This invention relates to an improved apparatus and method for bonding flip chip devices onto a substrate, such as a circuit board. More specifically, the invention is a semi-automatic system which enables high alignment and bonding accuracy of flipped chips to a substrate.

BACKGROUND ART

Flip chip bonding has emerged as one of the fastest growing technologies in packaging electronic components. Such technologies have developed in response to the demand for circuits which may operate at high speeds in high packing densities. Acceptable performance criteria may only be realized by appropriate selection of the substrate, interconnect mechanisms, flip chip design, and the bonding media (manufacturing reliable multichip modules).

Several methods may be used to attach a flip chip or die to a substrate. Solder is often used for silicon, aluminum nitride, alumina, or flexible substrates. Gold-to-gold thermocompression or ultrasonic bonding are mainly used for high power small devices. Standard conductive epoxy may also be used for flip chip bonding.

Among the issues which need to be considered when designing automated flip chip bonding mechanisms are placement accuracy, the types of flip chips and substrates, flip chip pickup and placement, substrate pickup and placement, throughput, and price.

Illustrative of previous approaches is U.S. Pat. No. 3,938,722 which discloses an apparatus for bonding flip chip devices onto mating conductive surfaces on a substrate utilizing ultrasonic energy. The bonding tool has a spherically shaped bonding surface which is caused by a pivoting mechanism to bond in a complex wobbling motion. Such approaches, however, may lead to relative lateral motion between the flip chip and the substrate which may jeopardize alignment.

U.S. Pat. No. 4,842,662 discloses a bonding approach wherein no gold globules or bumps are used in advance of the flip chip connection process. Such gold bumps are typically placed on the terminal pad of the flip chip and on the underside of the wire to be connected to the flip chip. The '662 disclosure, however, relates to single point bonding processes adapted for use with tape-automated-bonding (TAB) tape.

SUMMARY OF THE INVENTION

The present invention discloses a process and apparatus for bonding a flip chip to a substrate. The process includes the following steps:
1. positioning the flip chip above the substrate, the flip chip having an active face provided with conductive bumps, so that its active face is oriented toward the substrate;
2. placing the flip chip on the substrate so that the bumps align with a bonding pattern on the substrate;
3. lowering an ultrasonic horn having a flat surface onto a back side of the flip chip;
4. applying through the ultrasonic horn a force to the back side of the flip chip, the force being normal to the substrate so that minimal lateral displacement of the flip chip and the substrate results; and
5. activating the ultrasonic horn while the force is applied so that the ultrasonic energy is isothermally transferred across the flip chip to the substrate and a diffusion bond is created therebetween.

The invention also includes the manufacturing apparatus by which to practice the above-noted process.

BEST MODES(S) FOR CARRYING OUT THE INVENTION

The process and method of the present invention represent a system for multichip bonding to substrates. The apparatus disclosed can be operated as an accurate pickup or placement mechanism for registering the flip chips in relation to the bonding pattern defined on a substrate.

By way of overall orientation, the apparatus and process of the present invention is used to produce high density packaging applications which require high alignment and bonding accuracy of flipped chips or dies to substrates. The apparatus includes one pickup head and one bonding head. The first head picks up the flip chip from a waffle pack and places it on an orientor. The second head picks up the die from the orientor and brings it over the substrate. Machine vision is used for final alignment when the die is over the substrate.

As used herein, the term "ultrasonic bonding" includes a solid-state process in which the flip chip is bonded to the substrate by locally applying high-frequency vibratory energy thereto while the surfaces to be joined are held together under pressure. It is thought that the diffusion layer may be of the order of 2–3 kilo angstroms in thickness. The disclosed process can be used to bond flip chips to gold, silver, platinum, nickel, or copper metalized patterns on a substrate.

Figure 1:
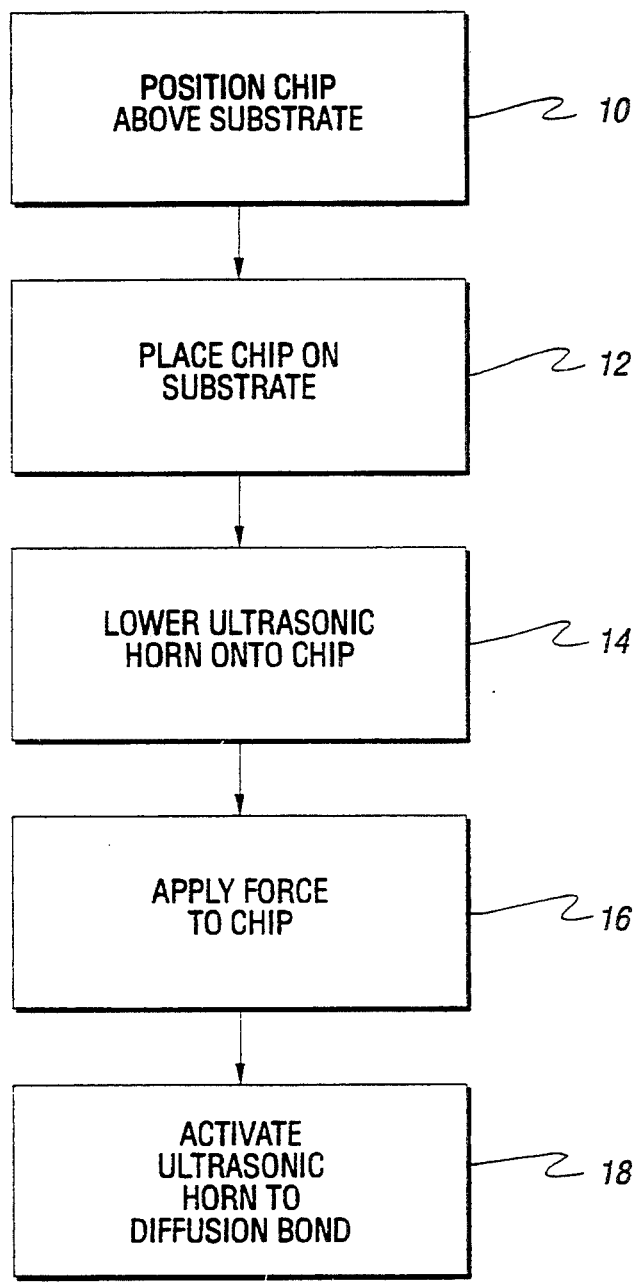
FIGS. 1 is a flow chart of the main process steps of the present invention.

FIG. 1 of the drawings is a flow chart of the main process steps used for practicing the process of the present invention.

The flip chip is positioned (10) above the substrate. Conventionally, the flip chip has an active face which is provided with gold globules or bumps. The active face is oriented toward the substrate. Next, the flip chip is placed (12) on the substrate so that the bumps align with a bonding pattern which is formed on the substrate. An ultrasonic horn is then lowered (14) so that its flat surface lies atop the back side of the flip chip. A force is then applied (16) through the ultrasonic horn to the back side of the flip chip so that the force is normal to the substrate. In this way, minimum lateral displacement of the flip chip in relation to the substrate results. Finally, the ultrasonic horn is activated (18) while the force is applied so that ultrasonic energy is isothermally transferred across the flip chip to the substrate and a diffusion bond is created therebetween.

Figure 2:
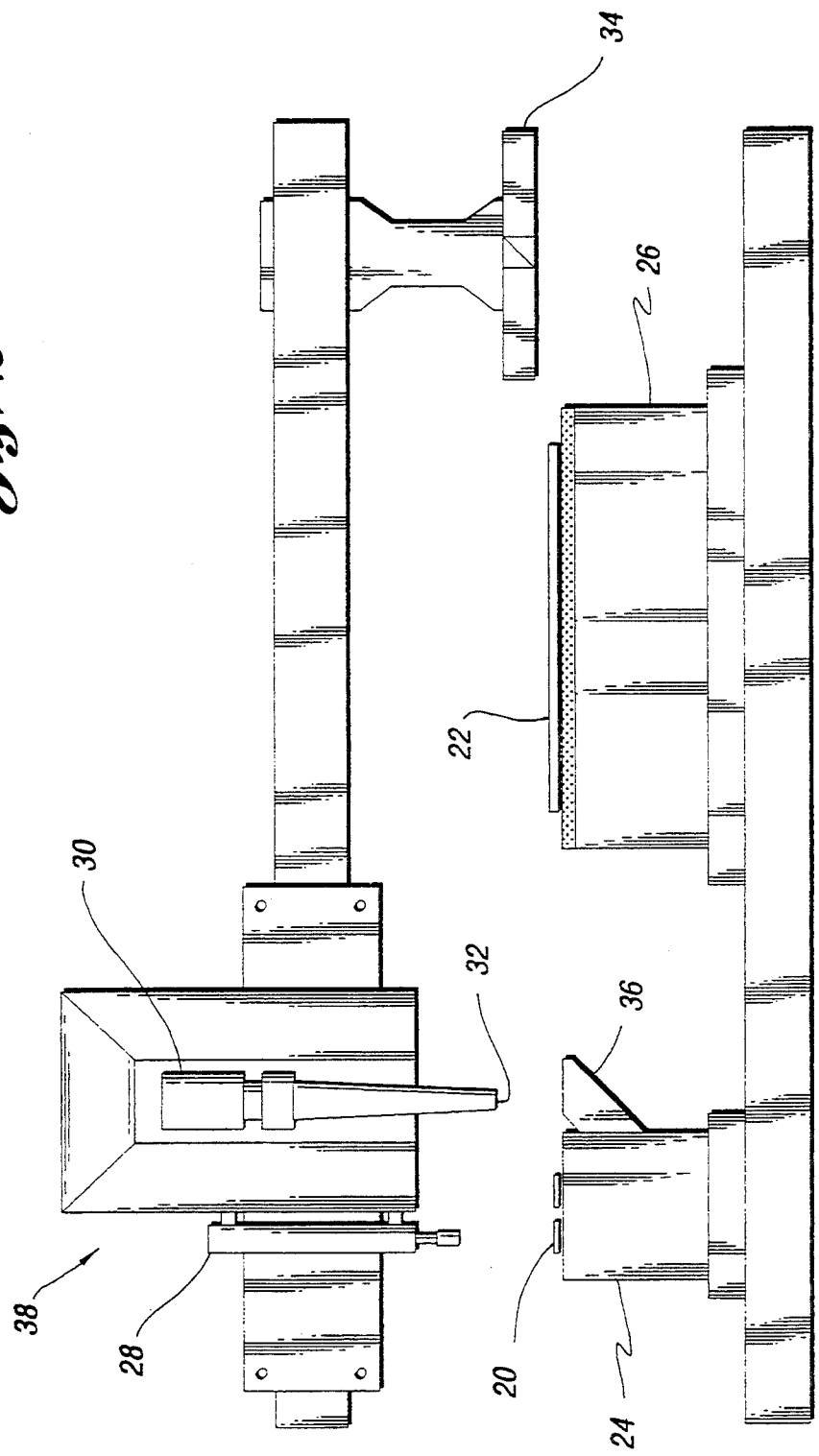
FIGS. 2–14 are side elevational views and depict various process steps and apparatus configurations used in bonding a flip chip to a substrate according to the teachings of the present invention.
Figure 3:
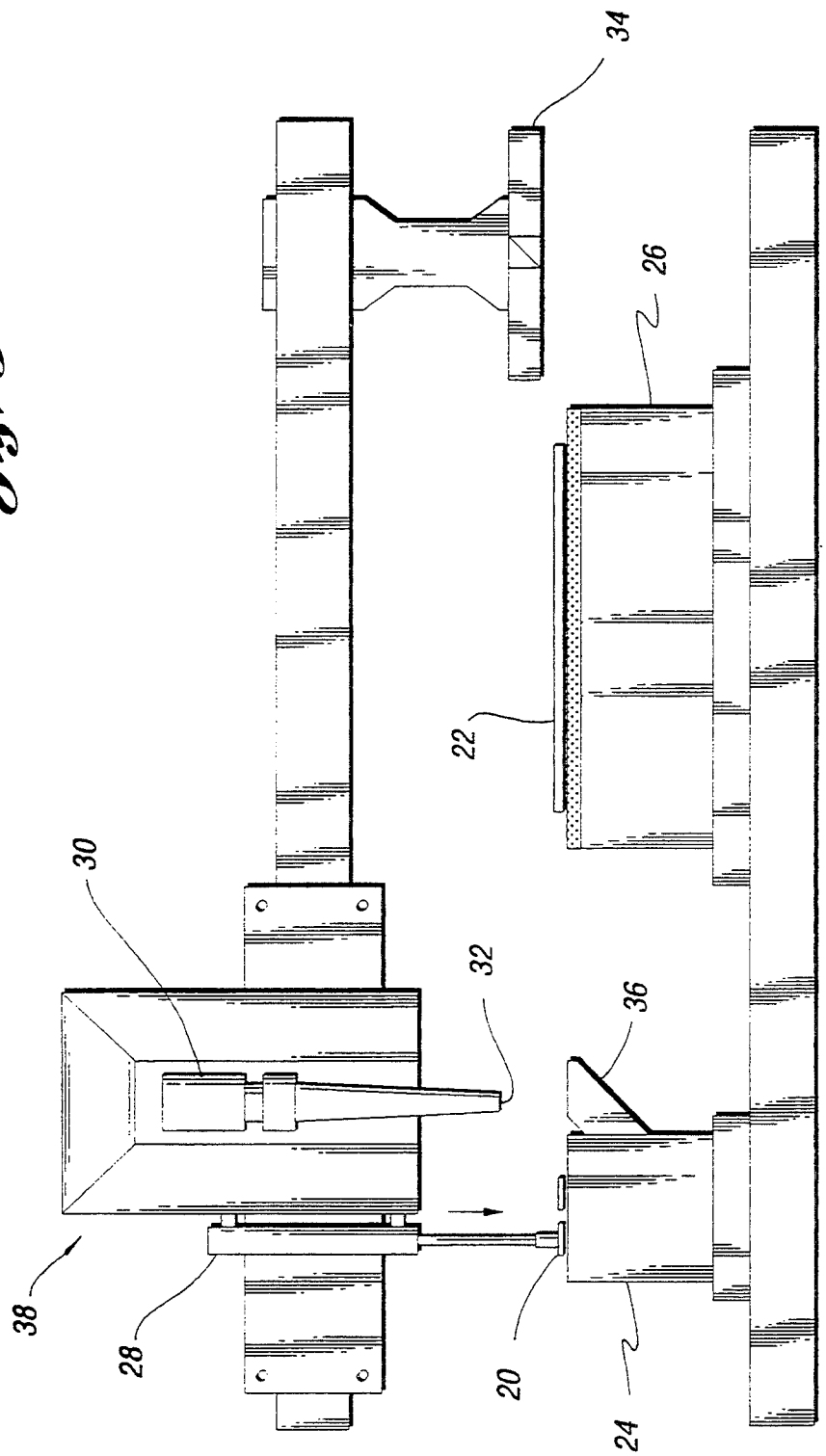

FIGS. 2–14 depict the apparatus and process steps in more detail. FIG. 2 depicts the main components of the apparatus used to practice the process disclosed and claimed herein. In FIG. 2, a flip chip 20 is loaded onto a flip chip pickup table 24. A substrate 22 is positioned upon a work holder 26. In FIG. 3, a vacuum flip chip pickup mechanism 28 is extended to pick up the flip chip 20 by use of vacuum.

Figure 4:
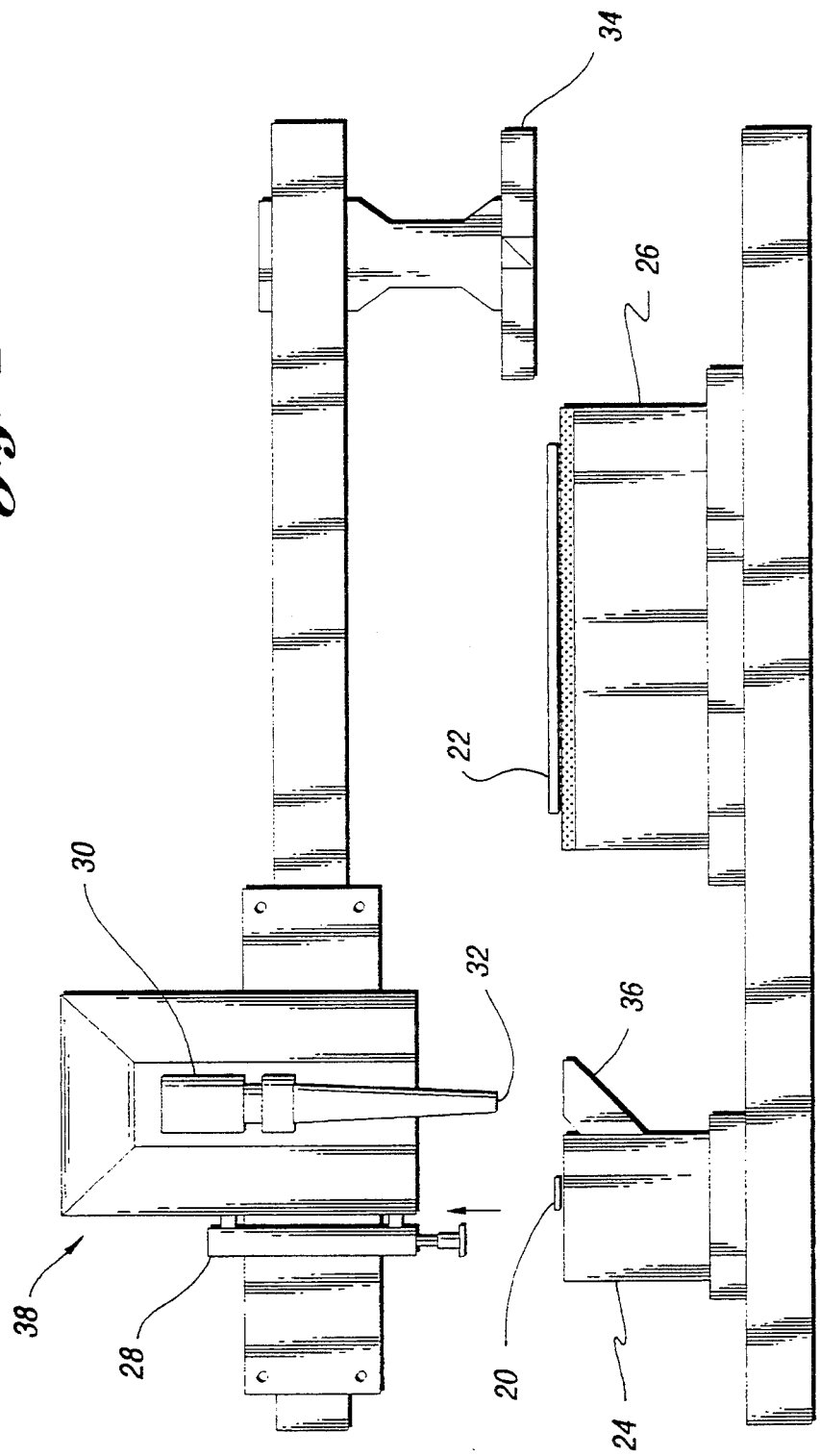
Figure 5:
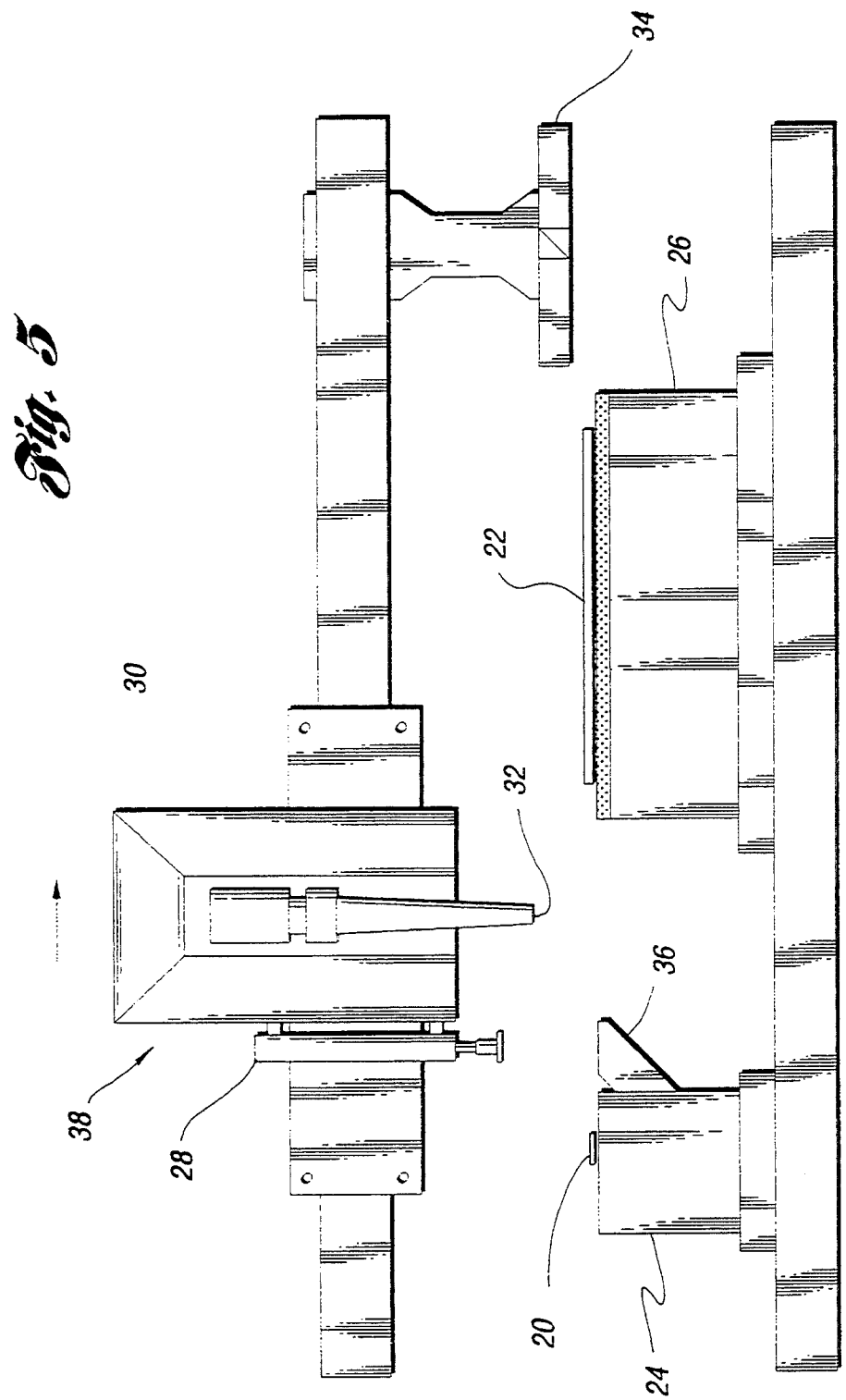
Figure 6:
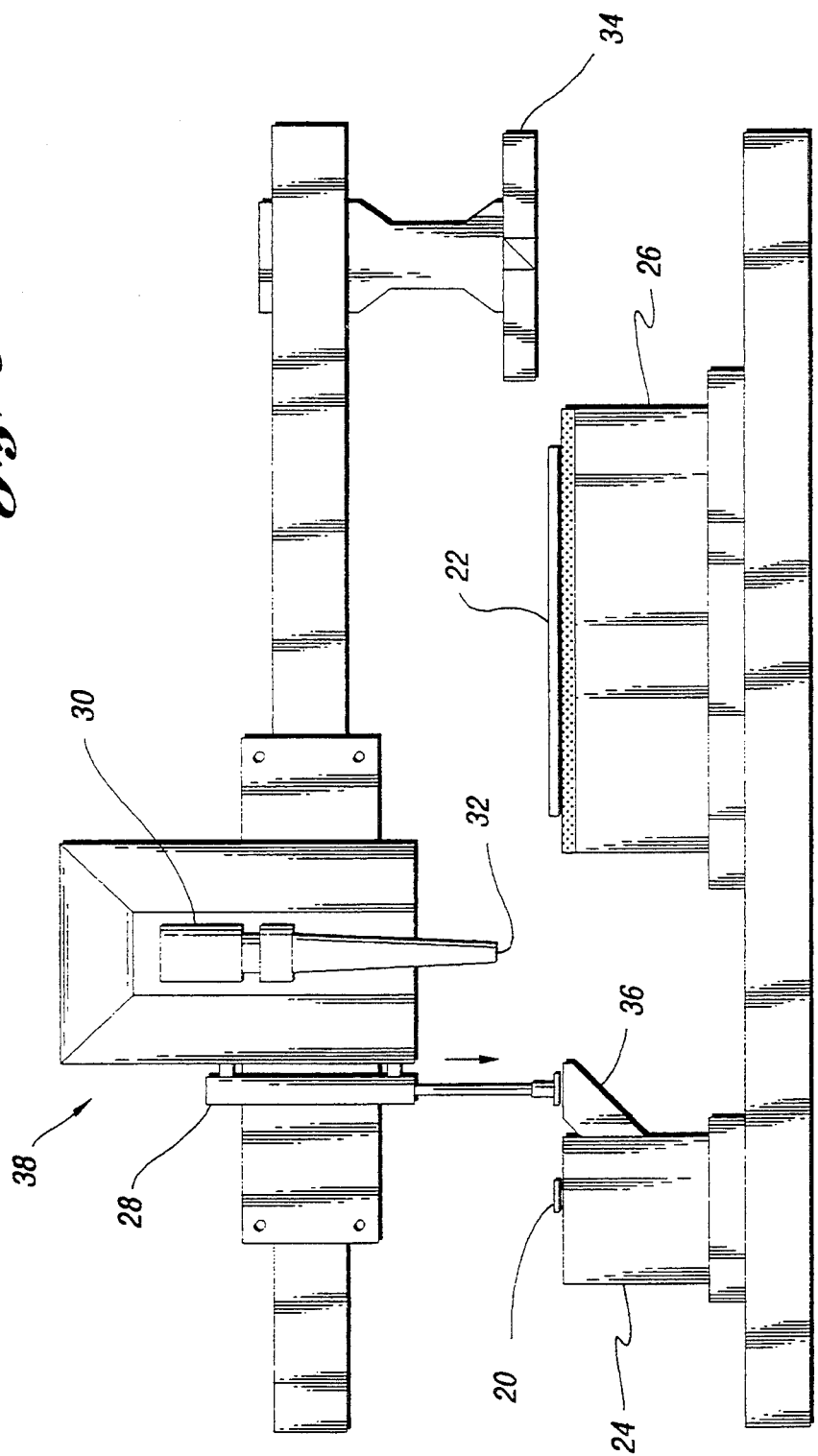
Figure 7:
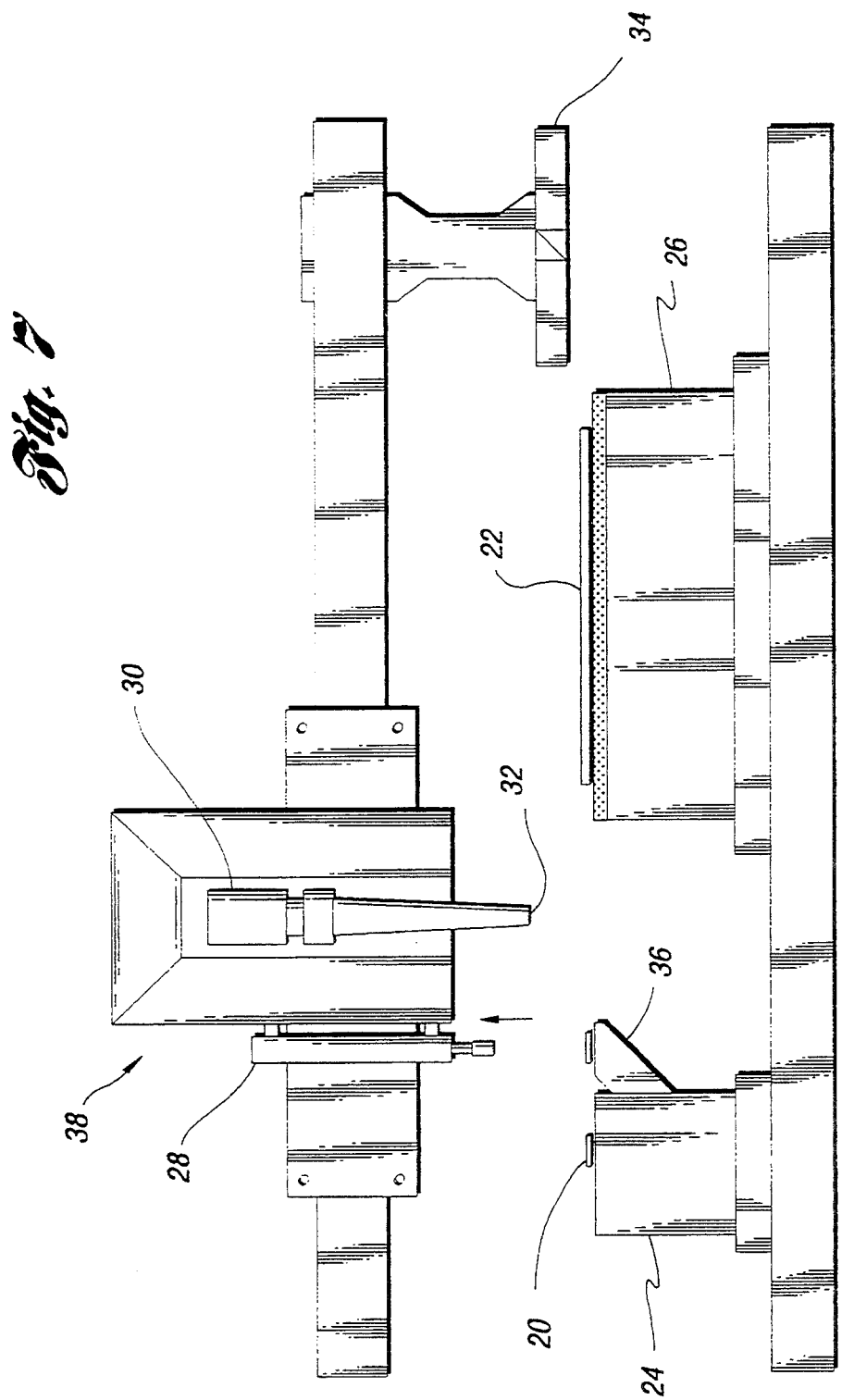
Figure 8:
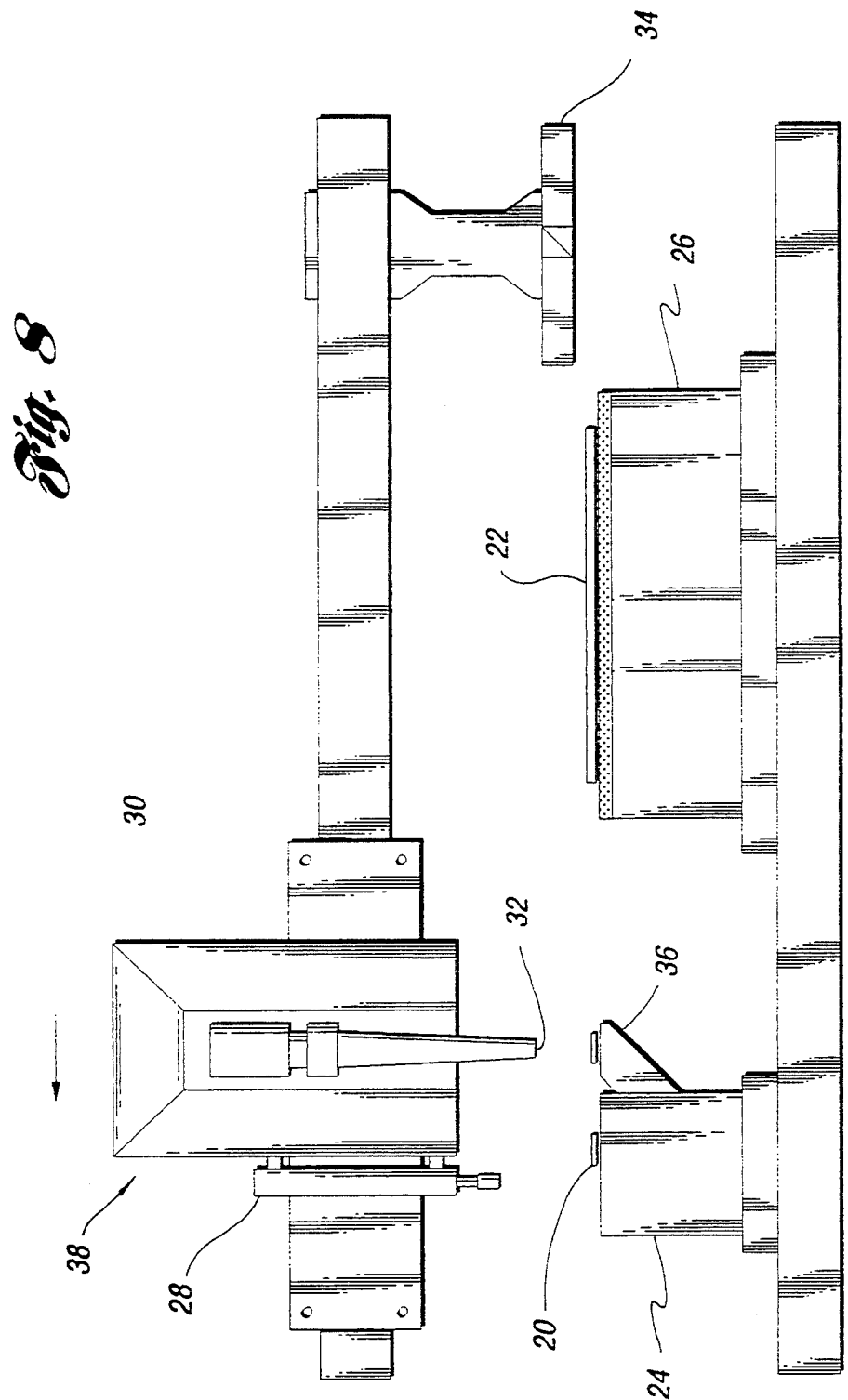
Figure 9:
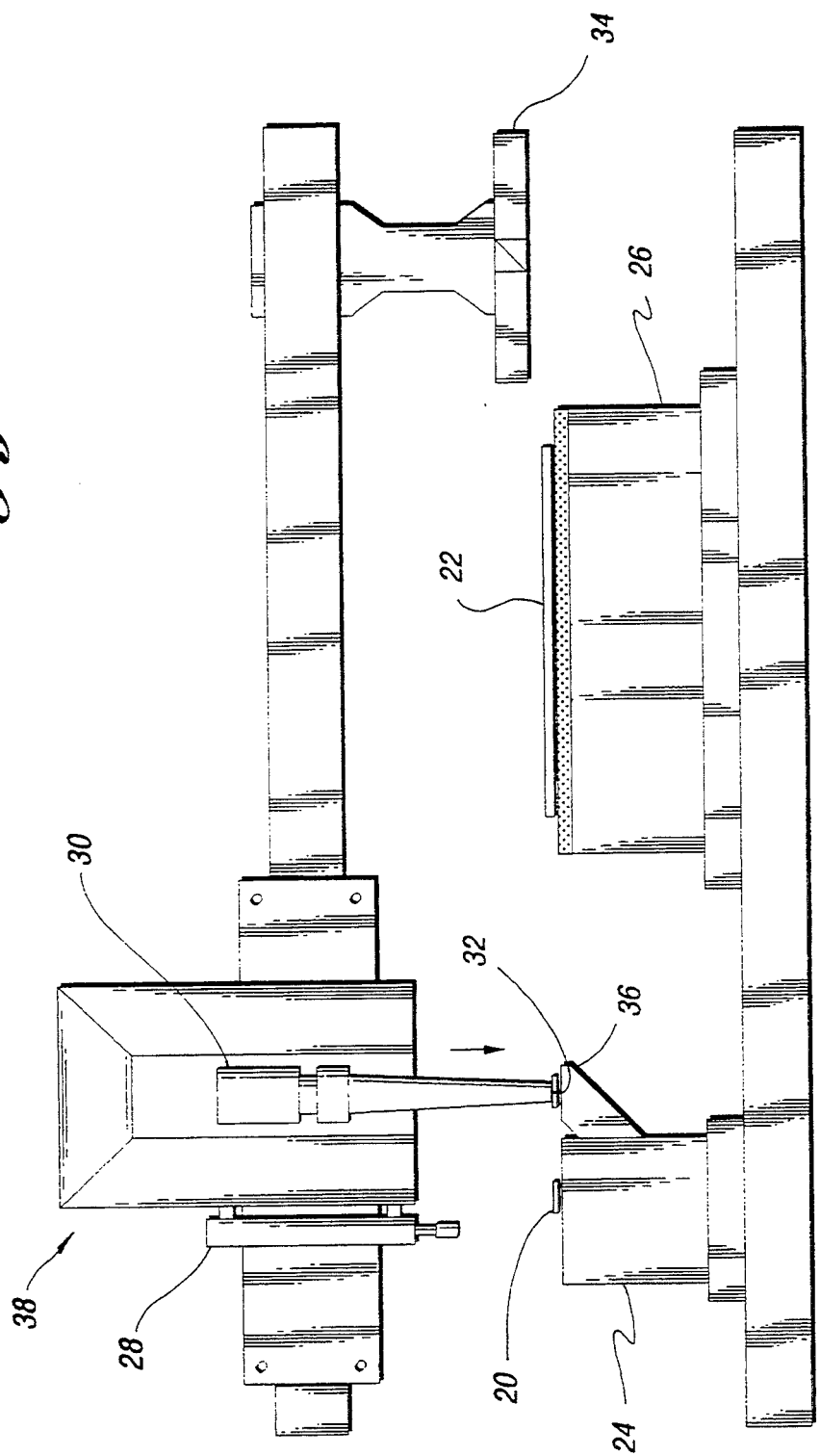

FIG. 4 shows the vacuum flip chip pickup arm retracted in combination, thus elevating the flip chip 20 above the flip chip pickup table 24. In FIG. 5, a stage 38 which includes the vacuum flip chip pickup mechanism 28 and an ultrasonic horn 30 is translated so that the vacuum flip chip pickup arm 28 with the flip chip 20 is aligned with a squaring device 36.

Next, the vacuum flip chip pickup arm 28 (FIG. 6) is extended to place the flip chip 20 onto the squaring device 36. The vacuum flip chip pickup arm 28 is then retracted (FIG. 7) and the squaring device 36 is activated to orient the flip chip 20 so that it is square in relation to the substrate 22. Next (FIG. 8) the stage 38 is translated so that the ultrasonic horn 30 is aligned with the squaring device 36. The ultrasonic horn 30 is then extended (FIG. 9) to pick up the flip chip 20 from the squaring device 36 using a vacuum. The vacuum is delivered by one or more bores which extend axially through the ultrasonic horn 30 toward a supply of negative pressure. The disclosed horn may be used for various flip chip sizes.

Figure 10:
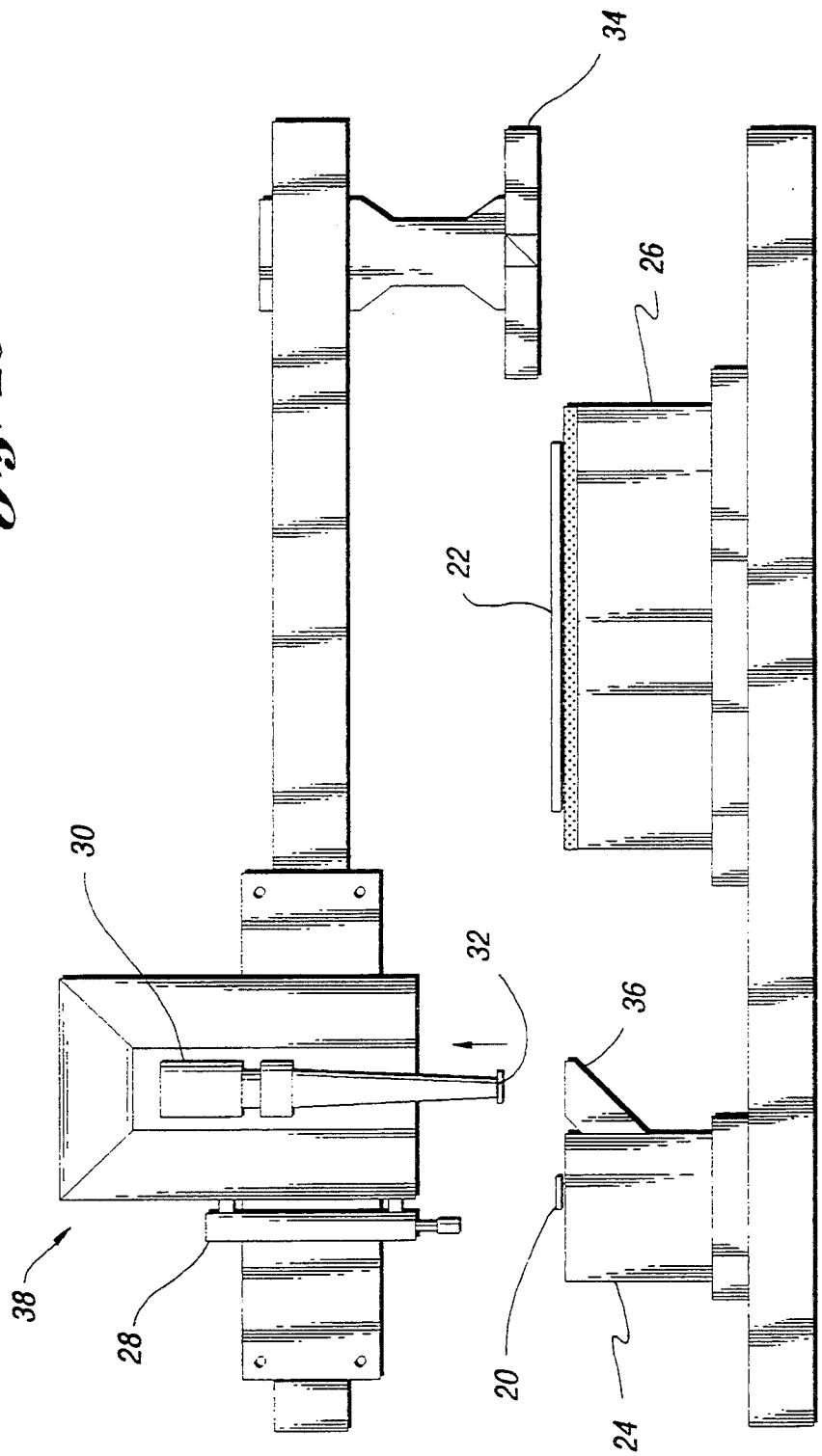
Figure 11:
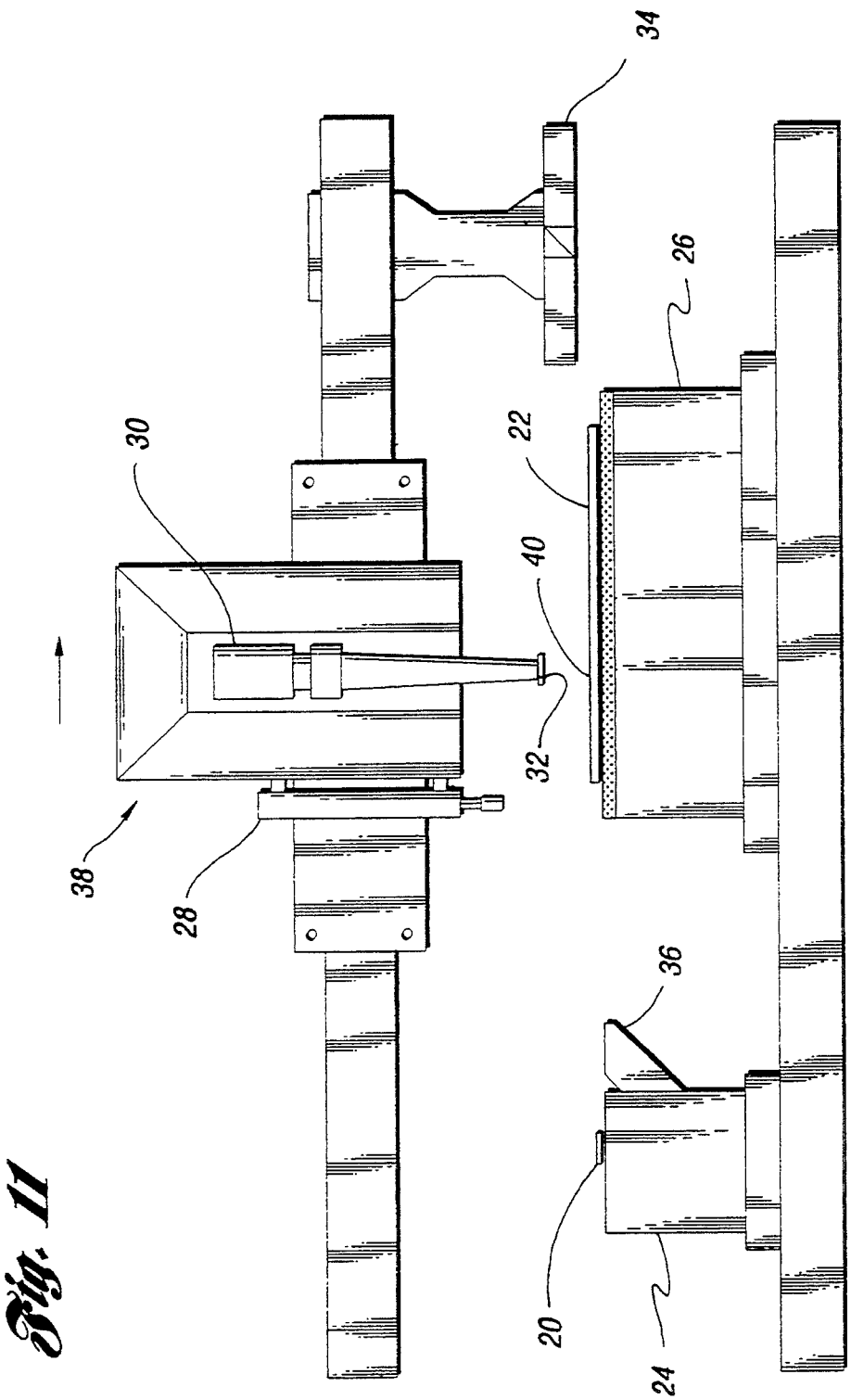

In FIG. 10, the ultrasonic horn 30 is shown as being retracted while carrying the flip chip 20 along with it. In FIG. 11, the stage 38 is translated so that the ultrasonic horn 30, together with the flip chip 20, is aligned opposite a bonding location 40 defined upon the substrate 22.

Figure 12:
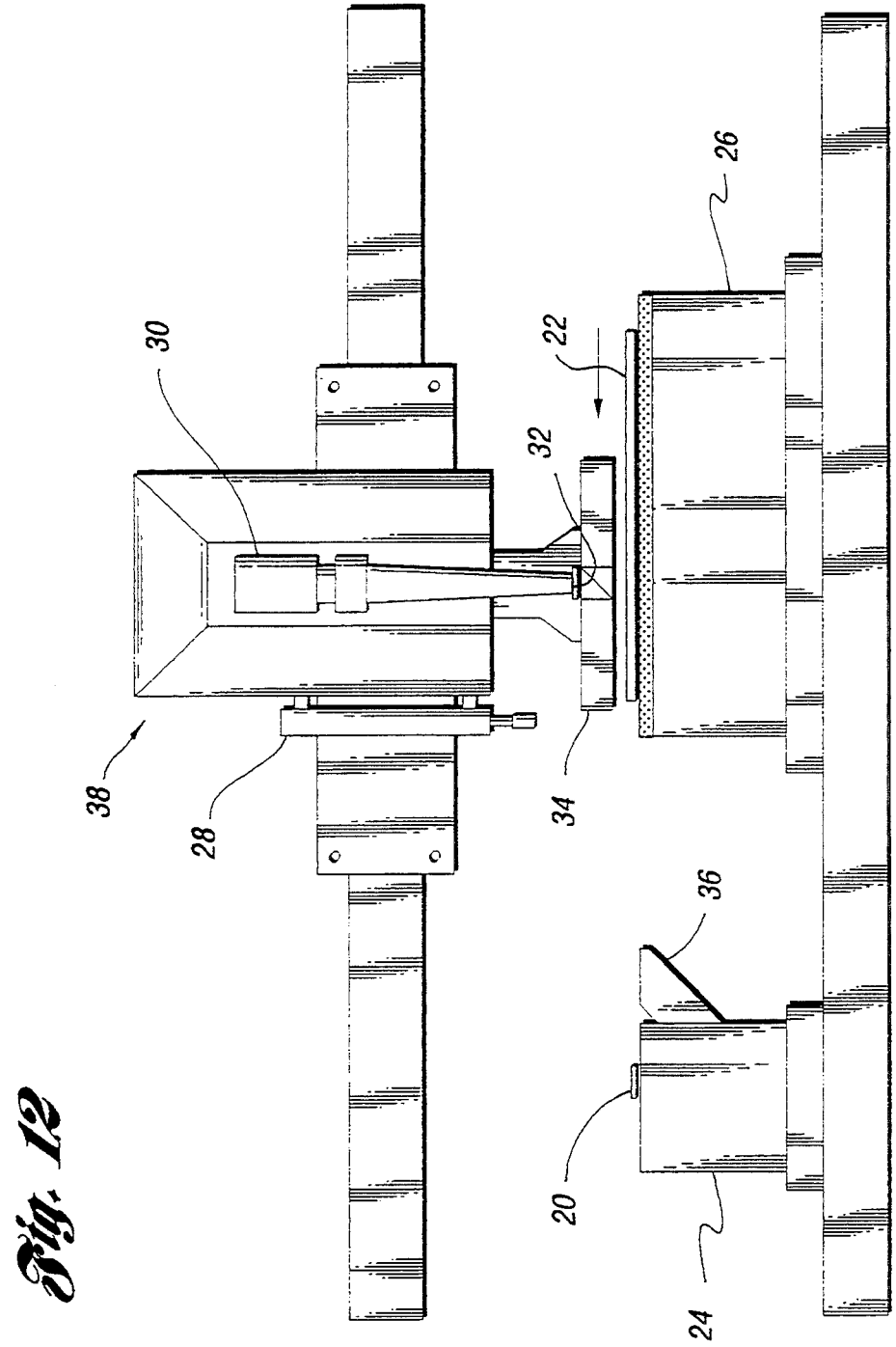

In FIG. 12, a means for alignment, such as an optical device 34, is translated to a location between the flip chip 20 and the substrate 22. Alignment of the flip chip 20 in relation to the substrate 22 then commences by manual or automatic means. Although an optical means for aligning has been disclosed, other alignment means may be used, such as split prisms and infrared techniques.

Figure 13:
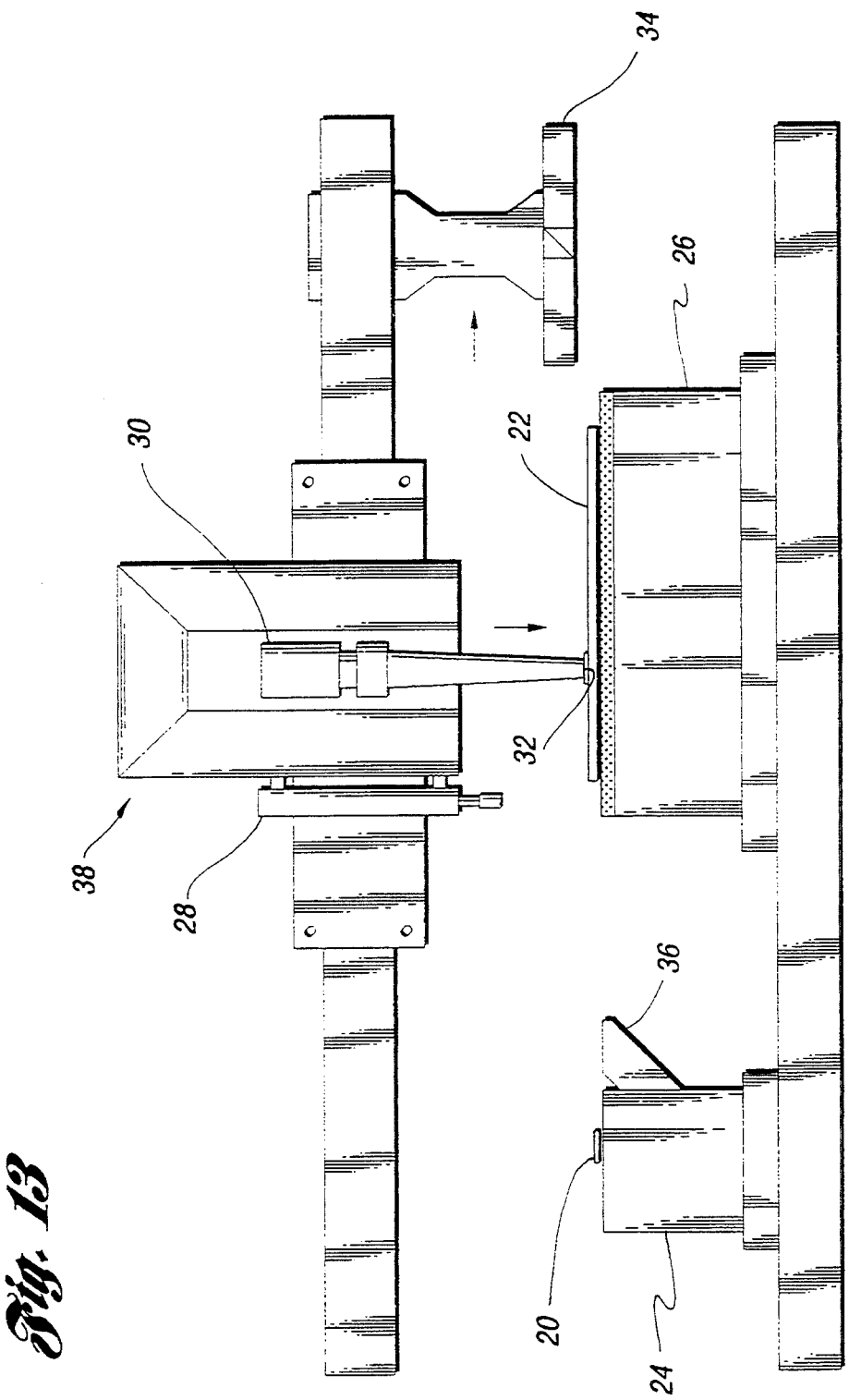
Figure 14:
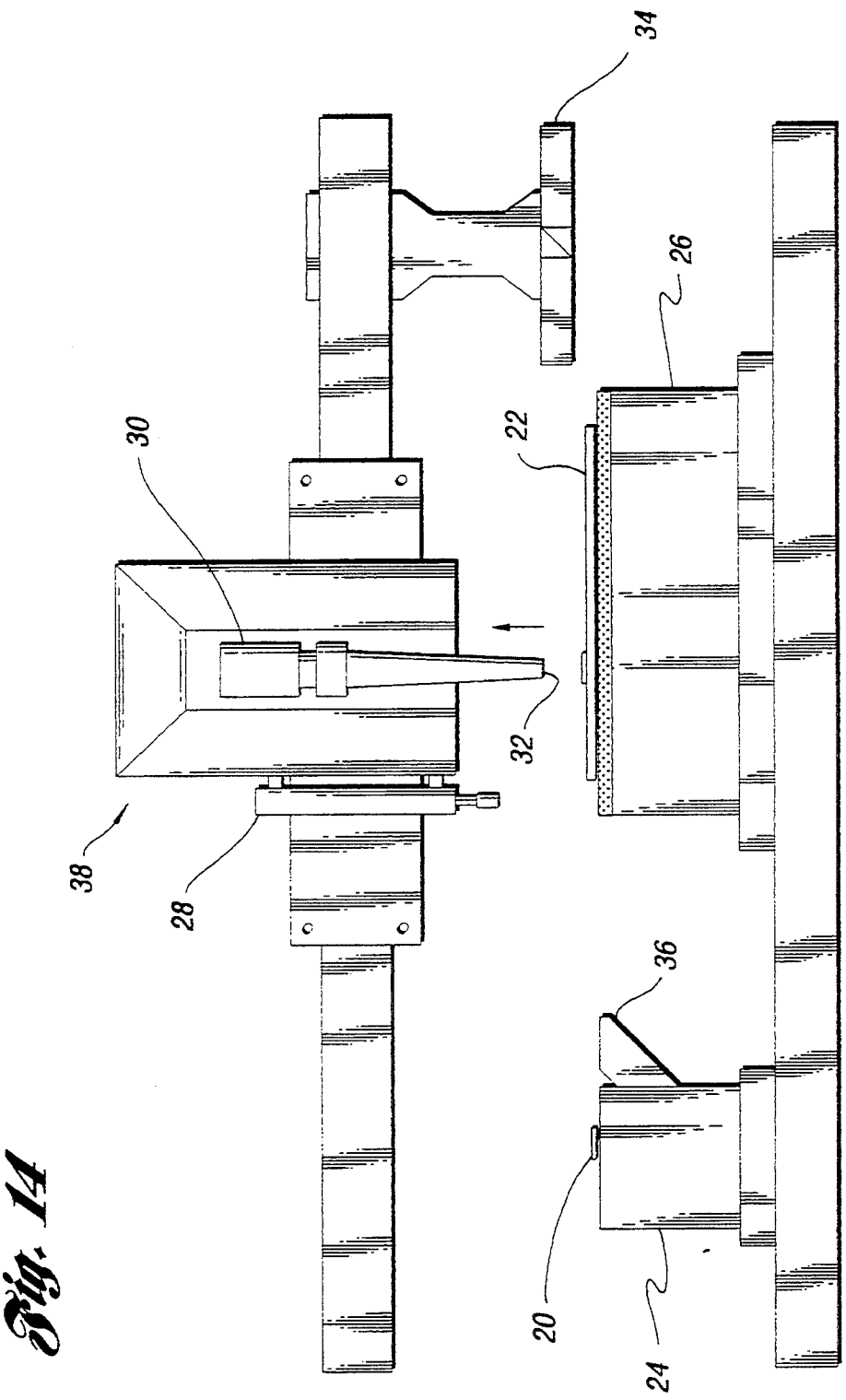

FIG. 13 depicts translation of the alignment device 30 to a neutral position and extension of the ultrasonic horn 30 to bring the flip chip 20 into contact with the substrate 22. A predetermined force of between 1 and 50 pounds and ultrasonic energy within a range of 60,000 to 100,000 oscillations per second are applied to the flip chip 20 for a predetermined time period of up to about 10 seconds.

To complete the cycle (FIG. 14), the ultrasonic horn 30 retracts, leaving the flip chip 20 joined to the substrate 22 by a secure diffusion bond.

X-ray photographs (not shown) of a flip chip 20 poised above a substrate 22 reveal a rectangular gray area is the back side of the substrate 22. In the aligned configuration, each dot represents a gold globule bump located on the active face of the flip chip 20. Extending away from the gold bumps is a bonding pattern which is defined by gold plated traces or leads defined on the top surface of the substrate 22.

Alignment or registration is enabled by the alignment device. Using the disclosed process and apparatus, all of the bumps disposed upon the flip chip are diffusion bonded simultaneously to the bonding sites defined upon the substrate 22.

In practice, when the ultrasonic horn is activated, microscopic surface contaminants and oxides are dispelled from the flip chip in the substrate, thereby producing an atomically clean surface for bonding. Preferably, when a force is applied to the flip chip, it is applied in stages. First, an initial force of, for example, 5 pounds is applied, followed by a second force of up to 20-50 pounds. Such forces tend to plastically deform the gold bumps adjacent a region of contact between the flip chip and the substrate so that an intimate contact therebetween results and an intermetallic atomic bond is formed by isothermal ultrasonic energy. In practice, if there are three bumps per flip chip, a 1-2 pound force should suffice. If there are 250 bumps, for example, a force amounting to 25-30 pounds should suffice if applied for a period of up to about 10-20 seconds.

The ultrasonic probe of the disclosed apparatus may be manufactured in various forms. One suitable vendor is Uthe Technology of Milpitas, Calif. The disclosed probe may be used with a 50-watt generator.

One type of flip chip attachment apparatus is manufactured by R D Automation of Piscataway, N.J. (Model AFC-101-AP). A machine produces alignment accuracy of better than±5 microns. Throughput amounts to 350-500 flip chips per hour depending upon the process parameters. In one system (M-8 flip chip bonder), a thin optical probe is inserted between the flip chip and the substrate, imaging both bonding surfaces simultaneously. Two video cameras and reflection illuminators are used to view the flip chip and the substrate individually. Outputs of the video systems are superimposed on one screen and the alignment is achieved by moving the substrate in reference to the stationary flip chip. Final alignment is performed when the flip chip is in close proximity to its final position, after which there is no motion in the X, Y, or theta directions. The only axes upon which motion may remain is in the vertical (Z) direction.

The substrate holder 26 may advantageously be made of granite. Thus, it will be apparent that the disclosed apparatus requires no heat, no solder, and is quick. Since no heat is required, the apparatus and process can be used for heat sensitive substrate flip chip bonding media and produces less damage to the flip chip compared to thermocompression bonding or solder reflow. Throughput is enhanced because an entire flip chip can be bonded to a substrate regardless of the number of connections. Finally, since all forces are in the vertical (Z) direction, there is no relative horizontal movement between the flip chip and the substrate.

In practice, substrates up to about 14 inches square may be accommodated within the disclosed apparatus. Flip chips as small as 0.05 inches square may be handled. Flip chips 1 inch square may also be effectively used by the disclosed process.

Thus, the disclosed invention not only improves bonding accuracy but also facilitates throughput because the pickup tool is also the bonding tool. This eliminates the need to place, retract, and engage the flip chip with the horn. The disclosed apparatus is a semi-automatic system for producing high density packaging applications which require high alignment and bonding accuracy of flipped chips to the substrate.

The ultrasonic probe of the present invention includes a tool tip which is approximately ¼ inches square. Tools for different flip chip sizes could be changed automatically. A probe can exert forces of up to 100 kilograms.

The substrates disclosed herein may be ceramic, epoxy laminated boards, or flexible circuits.

We therefore claim:

1. A process for bonding a flip chip to a substrate, comprising:

positioning the flip chip above the substrate, the flip chip having an active face provided with conductive bumps, so that its active face is oriented toward the substrate;

placing the flip chip on the substrate so that the bumps align with a bonding pattern on the substrate;

lowering an ultrasonic horn having a flat surface onto a back side of the flip chip;

applying through the ultrasonic horn a force to the back side of the flip chip, the force being normal to the substrate so that minimal lateral displacement of the flip chip and the substrate results; and activating the ultrasonic horn while the force is applied so that the ultrasonic energy in the form of oscillations is applied so that the oscillations are perpendicular to the substrate, the energy being isothermally transferred across the flip chip to the substrate and a diffusion bond is created therebetween.

2. The process of claim 1, wherein the activating step comprises delivering ultrasonic energy within a range of 60,000 to 100,000 oscillations per second.

3. The process of claim 2, further comprising the step of dispelling microscopic surface contaminants and oxides from the flip chip and the substrate, thereby producing an atomically clean surface for bonding.

4. The process of claim 3, further comprising the step of plastically deforming bumps adjacent a region of contact between the flip chip and the substrate so that an intimate contact therebetween results and an intermetallic atomic bond is formed.

5. The process of claim 1, wherein the placing step comprises aligning the flip chip with the bonding pattern on the substrate by viewing the flip chip and the substrate so that the bumps are indexed with a corresponding bonding pattern on the substrate before the lowering and force application steps.

6. The process of claim 1, wherein the step of applying a force to the flip chip comprises the step of applying a force up to 50 pounds.

7. The process of claim 6, wherein the step of applying a force to the flip chip comprises the step of applying a force up to 20 seconds.

8. The process of claim 1, wherein the conductive bumps are formed from gold.

9. The process of claim 1, wherein the conductive bumps are formed from indium.

10. The process of claim 1, further comprising the step of picking up the flip chip before positioning the flip chip above the substrate.

11. The process of claim 1, wherein the process is conducted at room temperature.

* * * * *